United States Patent [19]

Chen et al.

[11] Patent Number: 5,300,898

[45] Date of Patent: Apr. 5, 1994

[54] HIGH SPEED CURRENT/VOLTAGE CONTROLLED RING OSCILLATOR CIRCUIT

[75] Inventors: Dao-Long Chen; Robert D. Waldron, both of Fort Collins, Colo.

[73] Assignee: NCR Corporation, Dayton, Ohio

[21] Appl. No.: 921,157

[22] Filed: Jul. 29, 1992

[51] Int. Cl.$^5$ .......................... H03B 5/02; H03B 5/24
[52] U.S. Cl. ...................................... 331/57; 307/602;
307/603; 307/606; 331/108 A; 331/108 B; 331/177 R
[58] Field of Search .................. 331/57, 108 A, 108 B, 331/135, 177 R; 307/602, 603, 605, 606, 585

[56] References Cited

U.S. PATENT DOCUMENTS

4,876,519 10/1989 Davis ..................................... 331/57
5,012,142 4/1991 Sonntag .............................. 331/57 X

OTHER PUBLICATIONS

Johnson et al, IEEE Journal of Solid-State Circuits, pp. 1218–1219, Oct. 1988 "A Variable Delay Line PLL for CPU-Coprocessor Synchronization".

Kim, "High-Speed Clock Recovery in VLSI Using Hybrid Analog/Digital Techniques", Jun. 6, 1989, p. 49, Electronics Research Laboratory, College of Engineering, University of California, Berkley.

Primary Examiner—Sigfried H. Grimm
Attorney, Agent, or Firm—Douglas S. Foote

[57] ABSTRACT

A differential inverter such as may be used in an oscillator circuit. The differential inverter is connected between first and second current sources. The differential inverter includes first and second single signal CMOS inverters connected in parallel between the first and second controlled current sources. Each of the current sources is a MOS transistor. A bias circuit is connected to the control gates of the MOS transistors and provides bias signals thereto, the bias circuit includes a variable current source with bias signals being generated in response to the current flow in the variable current source.

25 Claims, 5 Drawing Sheets

HIGH SPEED CURRENT/VOLTAGE CONTROLLED RING OSCILLATOR CIRCUIT

BACKGROUND OF THE INVENTION

The present invention relates generally to CMOS (complementary metal-oxide-semiconductor) current-controlled and voltage-controlled oscillators wherein the frequency of oscillation is varied by changing an applied current or voltage, respectively, and, more particularly, to CMOS integrated circuits useful in constructing high speed current-controlled and voltage-controlled oscillators by interconnection of an odd plurality of oscillator cells, preferably three oscillator cells, into a ring configuration.

Current-controlled and voltage-controlled oscillators are widely used in both digital and analog systems to generate periodic waveforms having precisely controlled frequencies. Oftentimes, such oscillators are incorporated into phase-locked loops (PLLs) to provide phase and frequency tracking for the PLLs. One specific application for a PLL incorporating a current-controlled or voltage-controlled oscillator is a PLL clock generator which is used to generate a fast on-chip clock from a slower off-chip system clock.

When implemented utilizing bipolar or GaAs (gallium arsenide) technology, prior art current-controlled and voltage-controlled oscillators are capable of operating at frequencies beyond Ghz. However, when implemented using low cost CMOS technology, the maximum operating frequencies of known current-controlled and voltage-controlled oscillator circuits are substantially lower due in part to smaller transconductances which are inherent in MOS devices.

The use of sub-micron CMOS technology having improved transistor transconductances has increased the operating speed of many CMOS circuits such that they can be used in applications which previously required bipolar or GaAs devices. Unfortunately, known prior art CMOS current-controlled and voltage-controlled oscillator designs, even when implemented in sub-micron CMOS technology, fail to provide a useful frequency range approaching 1 Ghz.

Accordingly, there is a need for an improved design for CMOS current-controlled and voltage-controlled oscillator circuits which perform within such a higher frequency range.

SUMMARY OF THE INVENTION

This need is met by the improved CMOS oscillator circuit of the present invention which, in an illustrative embodiment, is controllably operable over a useful frequency range between approximately 260 Mhz and 700 Mhz. It should be understood that frequencies approaching and in fact exceeding Ghz should be possible utilizing the oscillator design of the present application as CMOS transistor transconductances are further improved. In its most basic form, the frequency of oscillation of the oscillator circuit is current-controlled; however, voltage control is conveniently available by adding a conventional voltage-to-current converter circuit to the input of the oscillator circuit.

The oscillator circuit of the present invention comprises an odd plurality of oscillator cells, three oscillator cells for highest frequencies of operation, which cells are interconnected into a ring configuration. Each oscillator cell includes a differential inverter made up of first and second single signal inverters which are connected in parallel to one another. The differential inverter receives differential input signals and is connected between first and second controlled current sources. The first controlled current source comprises a first current source transistor for charging the cell and the second controlled current source comprises a second current source transistor for discharging the cell.

Current source as used herein refers to a device which provides a generally uniform current over a wide range of load resistances. A transistor may be used as a current source when connected between a supply voltage and load if it is operating in its saturation region. However, a transistor is not a current source if it is operating in its ohmic or triode region.

A controlled current source as used herein refers to a current source in which the amount of current provided therefrom may be selected by an independent control mechanism. A transistor used as a current source is a controlled current source if there is a mechanism for varying the voltage applied to its control electrode. Of course, the applied voltage must not allow the transistor to enter its ohmic or triode region, in which case the transistor would no longer be a current source.

Control signals representative of a control current or voltage are provided to the first and second current source transistors to control the frequency of oscillation of the oscillator circuit: higher charge or discharge currents for the cells result in higher oscillation frequencies; and, lower charge or discharge currents for the cells result in lower oscillation frequencies.

Each oscillator cell also preferably comprises a booster circuit which increases the speed of the oscillator circuit by adding current to or subtracting current from the charge and discharge currents for the oscillator cells. Oscillator cell controller means generates control signals for the first and second current source transistors and also includes booster controller means for controlling the booster circuit.

A variable or controlled current source generates the control signals for the first and second current source transistors and a constant current source controls the booster circuit. Preferably, the first and second current source transistors in the oscillator cell are current-mirrored from current flowing in the controlled current source and additional current source transistors within the booster circuit are current-mirrored from current flowing in the constant current source. Such current mirror connections make the oscillator circuit of the present invention substantially independent of variations in the manufacturing process, operating temperature and power supply for the oscillator circuit.

In accordance with one aspect of the present invention, an integrated circuit device useful in constructing high speed current-controlled and voltage-controlled oscillators comprises a differential inverter connected between first and second controlled current sources. The differential inverter includes first and second single signal inverters connected in parallel between the first and second controlled current sources, which single signal inverters receive respective ones of differential input signals for the differential inverter.

A bias circuit generates bias signals for controlling the first and second controlled current sources in response to current flow in a variable current source of the bias circuit. The bias circuit also controls a booster circuit connected to the single signal inverters.

In accordance with another aspect of the present invention, an oscillator circuit having its frequency of oscillation controlled by a frequency control signal comprises an odd plurality of oscillator cells. The oscillator cells are interconnected in a ring configuration and each oscillator cell comprises a first current source transistor for charging the cell and a second current source transistor for discharging the cell. Oscillator cell controller means are provided for generating control signals to drive the first and second current source transistors of the oscillator cells, the oscillator cell controller means being responsive to the frequency control signal for generating the control signals.

It is an object of the present invention to provide an improved CMOS current-controlled or voltage-controlled oscillator circuit capable of operation at frequencies approaching 1 Ghz; to provide an improved CMOS current-controlled or voltage-controlled oscillator circuit made up of an odd plurality of oscillator cells, three oscillator cells for the highest possible frequencies of oscillation, interconnected in a ring configuration; to provide an improved CMOS current-controlled or voltage-controlled oscillator circuit made up of an odd plurality of differential oscillator cells connected into a ring configuration and including current source transistors which are current-mirrored from current flow in a controlled current source to compensate for process, temperature and supply voltage variations; to provide an improved CMOS current-controlled or voltage-controlled oscillator circuit made up of an odd plurality of differential oscillator cells connected into a ring configuration and including booster circuitry for speeding up the operation of the circuit; and, to provide an improved CMOS current-controlled or voltage-controlled oscillator circuit made up of an odd plurality of differential oscillator cells connected into a ring configuration and including booster circuitry comprising current source transistors which are current-mirrored from current flow in a constant current source to compensate for process, temperature and supply voltage variations.

Other objects and advantages of the invention will be apparent from the following description, the accompanying drawings and the appended claims.

DETAILED DESCRIPTION OF THE INVENTION

Figure 1:
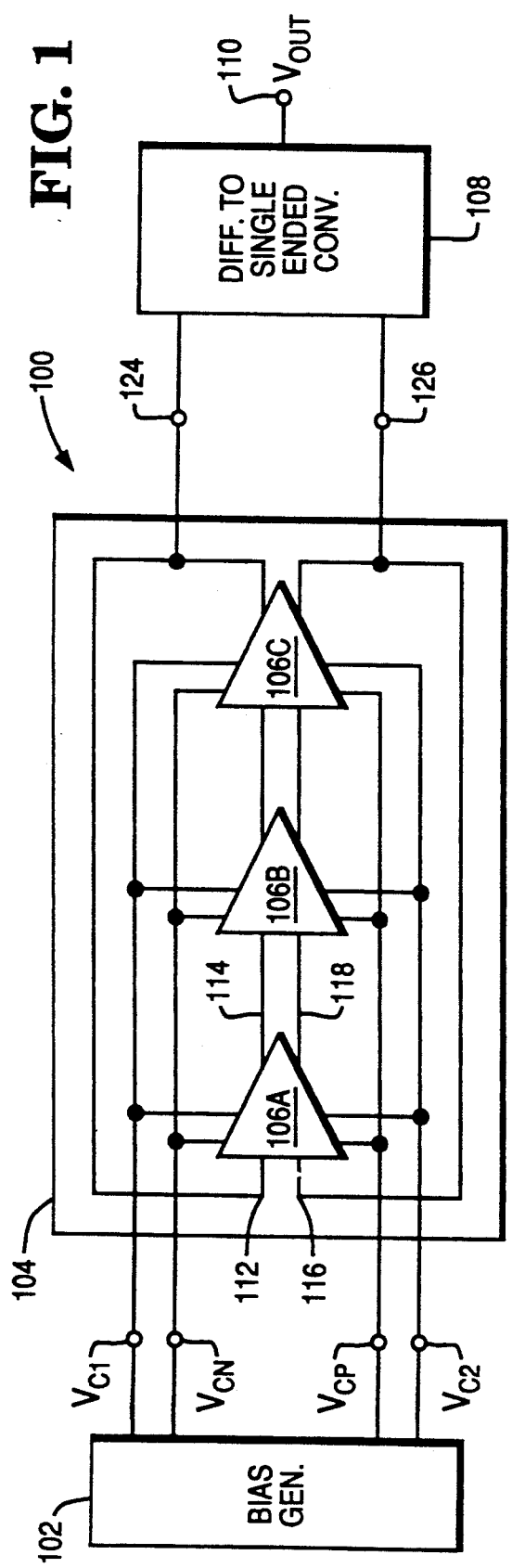
FIG. 1 is a block diagram of a CMOS current-controlled or voltage-controlled oscillator circuit in accordance with the present invention.

A CMOS current-controlled or voltage controlled oscillator circuit 100 of the present invention shown in block diagram form in FIG. 1 comprises oscillator cell controller means or a bias generator circuit 102 which is connected to control a differential ring oscillator 104. The differential ring oscillator 104 comprises an odd plurality of oscillator cells, with three differential oscillator cells 106A, 106B and 106C being included in the illustrated embodiment.

Since the oscillator cells 106A, 106B and 106C are identical to one another, only the oscillator cell 106A will be described herein with reference to FIGS. 4A and 4B. The output of the differential ring oscillator 104 is connected to differential to single ended converter means 108, shown in detail in FIG. 3, to generate a single ended output signal at the output 110 of the oscillator circuit 100.

For simplicity sake, only three differential oscillator cells 106A, 106B and 106C are shown in FIG. 1; however, it is to be understood that any reasonable odd plurality (3, 5, 7, 9, etc.) of differential oscillator cells can be utilized in the present invention. As the number of oscillator cells is increased, the frequency range of the corresponding oscillator is lowered. Accordingly, the illustrated embodiment of the CMOS oscillator circuit 100 having three differential oscillator cells provides an oscillator in accordance with the present invention having the highest range of operating frequencies.

Figure 4A:
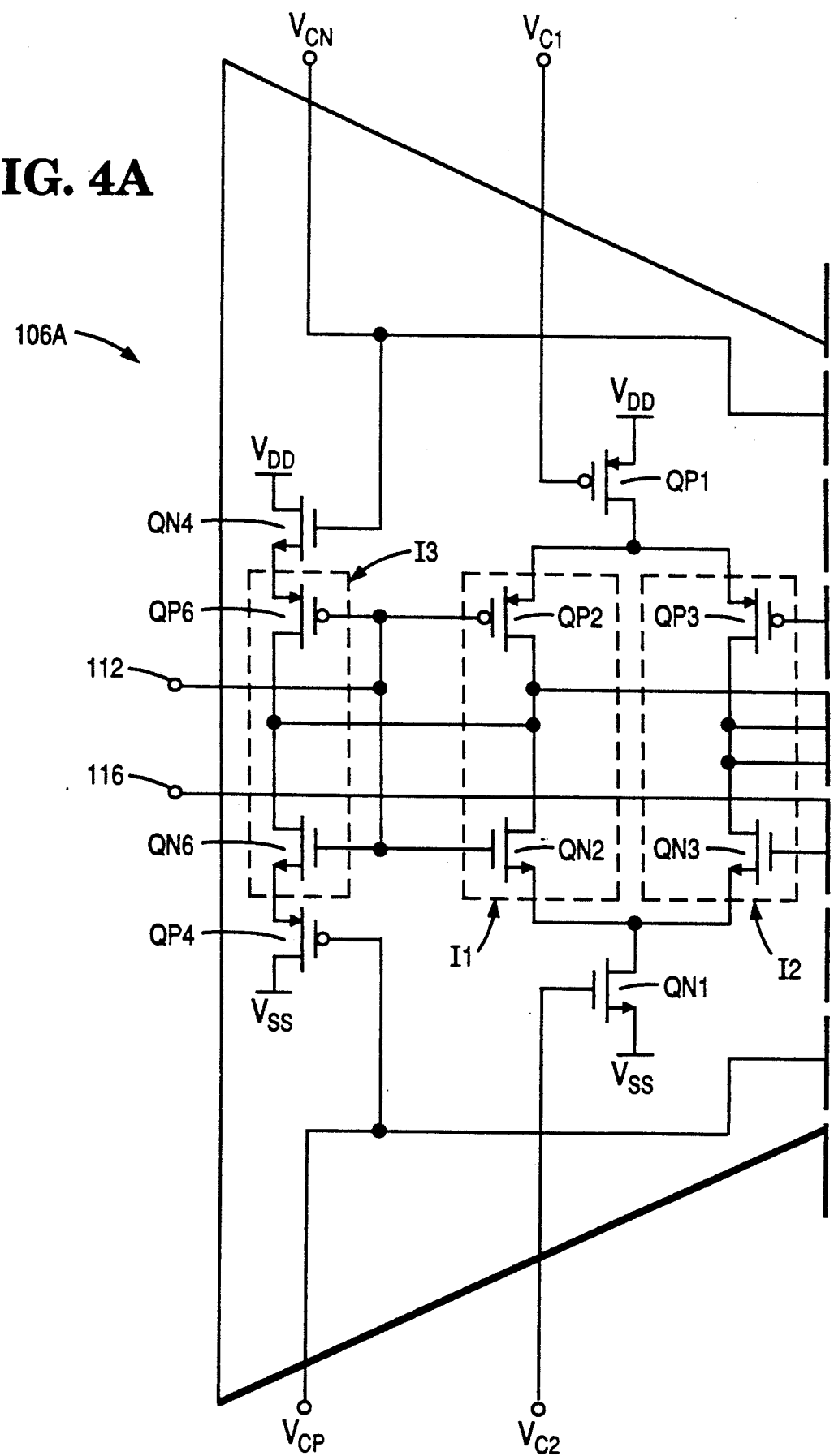
FIGS. 4A and 4B when positioned beside one another form a schematic diagram of a differential oscillator cell of the CMOS oscillator circuit of FIG. 1.
Figure 4B:
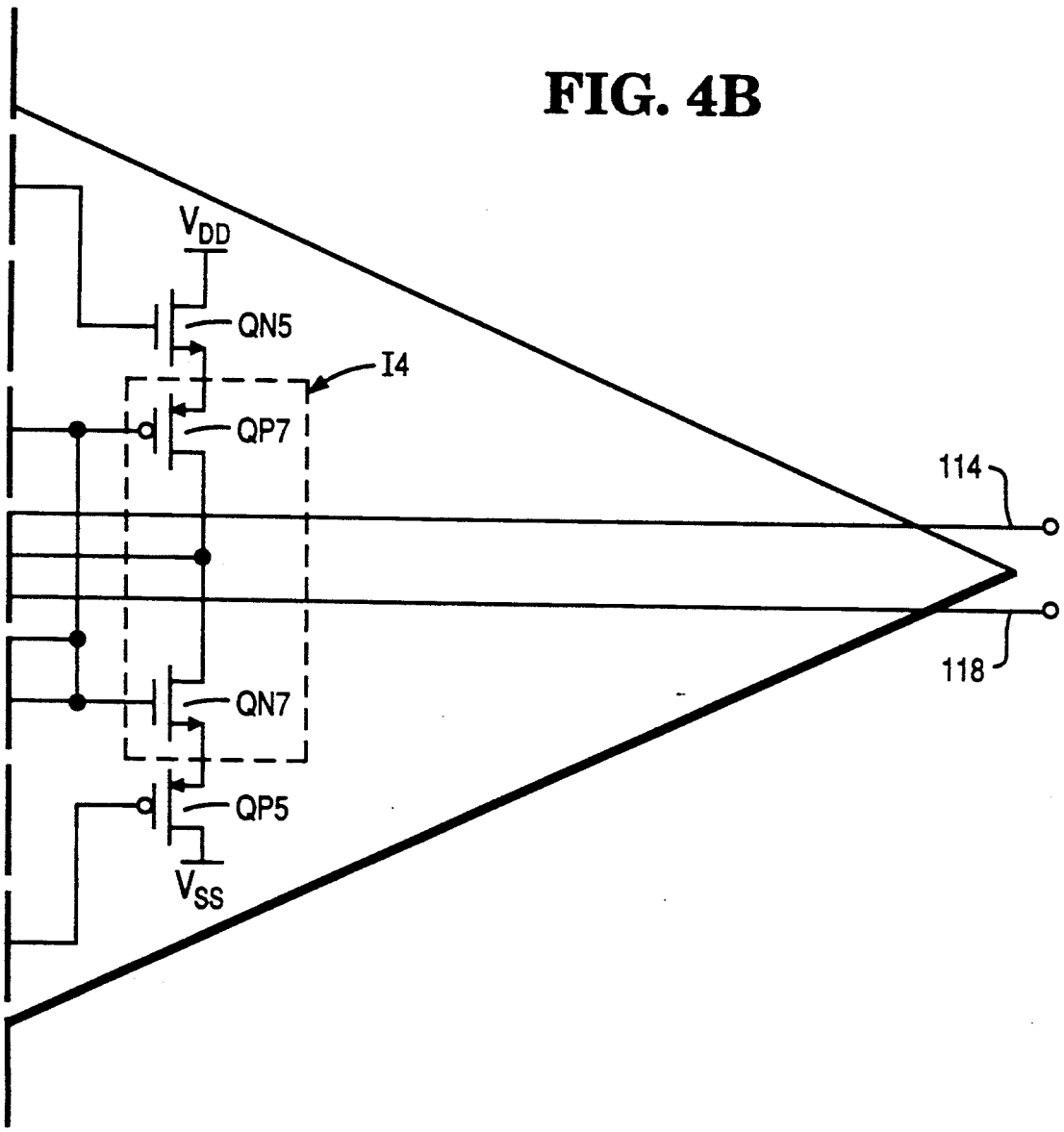

A schematic diagram of the differential oscillator cell 106A of the CMOS oscillator circuit 100 is shown in FIGS. 4A and 4B, and comprises a first P-channel controlled current source transistor QP1 for charging the oscillator cell 106A and a second N-channel controlled current source transistor QN1 for discharging the oscillator cell 106A. First and second CMOS transistors comprising a P-channel transistor QP2 and a N-channel transistor QN2 are connected in series between the first current source transistor QP1 and the second current source transistor QN1. The gates of the transistors QP2 and QN2 are connected to one another to define a first input 112 for the cell 106A and the interconnection between the transistors QP2 and QN2 defines a first output 114 for the cell 106A. The series connection of the transistor QP2 and QN2 form a first single signal inverter I1 having an input line which is the same as the input 112 for the cell 106A and an output line which is the same as the output 114 for the cell 106A.

Third and fourth CMOS transistors comprising a P-channel transistor QP3 and a N-channel transistor QN3 are also connected in series between the first current source transistor QP1 and the second current source transistor QN1. The gates of the transistors Qp3 and QN3 are connected to one another to define a second input 116 for the cell 106A and the interconnection between the transistors QP3 and QN3 defines a second output 118 for the cell 106A. The series connection of the transistor QP3 and QN3 form a second single signal inverter I2 having an input line which is the same as the input 116 for the cell 106A and an output line which is the same as the output 118 for the cell 106A.

The parallel connection of the single signal inverters I1 and I2 forms a differential inverter, with each of the single signal inverters I1, I2 receiving respective ones of differential inputs for the differential inverter. "Differential inverter" will be used herein to identify an inverter which receives differential input signals, e.g. one logically high and the other logically low, at respective inputs, inverts each input signal and provides the inverted form of the input signals at respective outputs. The combination of the differential inverter made up by the single signal inverters I1, I2 with the controlled current source transistor QP1 and the controlled current source transistor QN1 forms a controllable differential inverter cell which is connected between first and second reference voltage sources VDD and VSS. The controllable differential inverter cell provides a pair of differential output signals having voltage levels with a midpoint generally equal to the midpoint of the voltage levels of the first and second voltage sources VDD and VSS.

As shown in FIG. 1, the oscillator cells 106A, 106B and 106C are interconnected into a ring configuration with the first input of each oscillator cell being connected to the first output of the cell preceding it in the ring configuration; the second input of each oscillator cell being connected to the second output of the cell preceding it in the ring configuration; the first output of each oscillator cell being connected to the first input of the cell succeeding it in the ring configuration; and, the second output of each oscillator cell being connected to the second input of the cell succeeding it in the ring configuration.

As previously noted, the transistors QP1 and QN1 form controlled current sources which determine the amplitude of the charge and discharge current, respectively, for the oscillator cells such as the oscillator cell 106A. A higher charge or discharge current results in a higher frequency of oscillation for the CMOS oscillator circuit 100 and a smaller charge or discharge current results in a lower frequency of oscillation.

In order to achieve higher frequencies of oscillation, a differential design is preferred such that one of the transistors of each of the pairs QP2, QN2 and QP3, QN3 is turning on while the other is turning off with oscillation signals circulating through the odd plurality of oscillator cells 106A, 106B and 106C as a result of the interconnection of the cells 106A, 106B and 106C in a ring configuration as shown in FIG. 1.

As shown in FIGS. 4A and 4B, the oscillator cells are symmetrical with respect to the current source transistors QP1 and QN1. For example, the transistor QP2 is the same as the transistor QP3 and the transistor QN2 is the said as the transistor QN3. As a result, the current source transistor QP1 is never turned off since, at any moment, one of the two transistors QP2 and QP3 is conducting. Similarly, the current source transistor QN1 is never turned off, since, at any moment, one of the two transistors QN2 and QN3 is conducting. Accordingly, the charge stored in the drains of the transistors QP1 and QN1 does not have to be discharged and charged for each oscillation cycle. Since the transistors QP1 and QN1 are relatively large, it substantially reduces the oscillation frequency if the drain capacitors of these transistors have to be charged and discharged each oscillation cycle.

To further improve the operating speed of the CMOS oscillator circuit 100, booster circuit means is incorporated into each of the oscillator cells for adding to or subtracting from the charging and discharging currents supplied by the current sources transistors QP1 and QN1. As shown in FIGS. 4A and 4B, the booster circuit means includes first current source booster transistor means comprising N-channel current source transistors QN4, QN5 for charging the oscillator cell 106A and second current source booster transistor means comprising P-channel current source transistors QP4, QP5 for discharging the oscillator cell 106A.

First and second CMOS booster transistors comprising a P-channel transistor QP6 and a N-channel transistor QN6 are connected in series between the transistor QN4 of the first current source booster transistor means QN4, QN5 and the transistor QP4 of the second current source booster transistor means QP4, QP5. The gates of the transistors QP6 and QN6 are connected to one another and to the first input 112 for the oscillator cell 106A and the interconnection between the transistors QP6 and QN6 is connected to the first output 114 for the oscillator cell 106A.

Thus, the transistors QP6 and QN6 form a third inverter I3 sharing the input 112 and output 114 with the first single signal inverter I1. The third inverter I3 is connected between a third controlled current source defined by the transistor QN4 and a fourth controlled current source defined by the transistor QP4.

Figure 2:
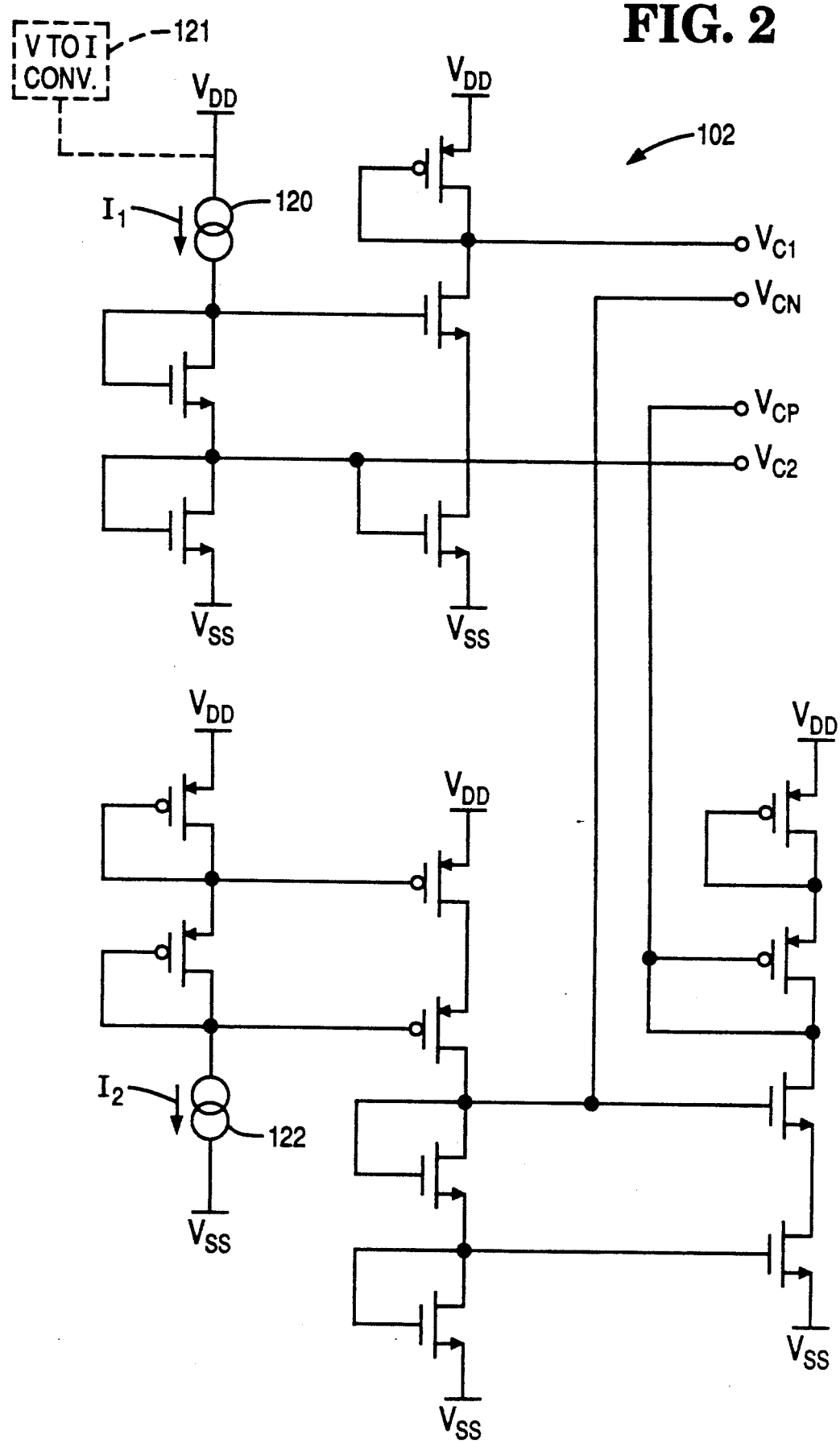
FIG. 2 is a schematic diagram of a bias generator circuit or oscillator cell controller of the CMOS oscillator circuit of FIG. 1.

Third and fourth CMOS booster transistors comprising a P-channel transistor QP7 and a N-channel transistor QN7 are also connected in series between the transistor QN5 of the first current source booster transistor means QN4, QN5 and the transistor QP5 of the second current source booster transistor means QP4, QP5. The gates of the transistors QP7, QN7 are connected to one another and to the second input 116 for the oscillator cell 106A and the interconnection between the transistors QP7, QN7 is connected to the second output 118 for the oscillator cell 106A. The first and second current source booster transistor means QN4, QN5 and QP4, QP5 are driven by booster control signals generated by the bias generator circuit 102 as shown in FIG. 2 and as will be described hereinafter.

Thus, the transistors QP7 and QN7 form a fourth inverter I4 sharing the input 116 and output 118 with the second single signal inverter I2. The fourth inverter I4 is connected between a fifth controlled current source defined by the transistor QN5 and a sixth controlled current source defined by the transistor QP5.

Since the purpose of the booster circuit is to increase the oscillation frequency by adding or subtracting current from the charge or discharge current supplied by the current source transistors QP1 and QN1, the current source booster transistors QN4 and QN5 are N-channel transistors instead of p-channel transistors. By using N-channel transistors and connecting their drains to the CMOS supply voltage VDD, the maximum output voltage of the booster circuit is one threshold voltage below VDD. Similarly, by using P-channel transistors for the transistor QP4 and QP5 and connecting their sources to the CMOS supply voltage VSS, the minimum output voltage of the booster circuit will be one threshold voltage above VSS. As a result, the output voltage of the booster circuit will not be too high to change the drain voltage of the current source transistor QP1 or too low to change the drain voltage of the current source transistor QN1.

As previously described, the oscillation frequency of the CMOS oscillator circuit 100 of the present invention is determined by the charge and discharge currents from the current source transistors QP1 and QN1. In order to change the charge and discharge currents, we need to change the biases on the gates of the current source transistors QP1 and QN1. FIG. 2 is a schematic diagram of the bias generator circuit 102 or oscillator cell controller means of the CMOS oscillator circuit 100. The bias generator circuit 102 generates bias voltages, i.e. the control signals for the current source transistors QP1 and QN1 and the booster control signals for the first and second current source booster transistor means QN4, QN5 and QP4, QP5.

The bias voltages or control signals at the gates of the current source transistors QP1 and QN1 are determined by a control current I1 which flows in a variable or controlled current source 120. If voltage control is desired, a conventional CMOS voltage-to-current converter circuit 121 can be used in place of the controlled current source 120 as will be apparent to those skilled in the art. Since a number of alternate designs are well known in the art, the CMOS voltage-to-current converter circuit 121 will not be illustrated in detail or described herein.

If the control current I1 is increased, VC1 will be decreased and VC2 will be increased. Accordingly, the CMOS oscillator circuit 100 oscillates at a higher frequency. Since the charge and discharge currents from the current source transistors QP1 and QN1 are current-mirrored from the control current I1, they are substantially independent of process, temperature, and power supply variations. In a similar manner, the charge and discharge currents in the booster circuit are also current-mirrored from a control current I2 which flows in a constant current source 122 and accordingly the booster currents also are substantially independent of process, temperature, and power supply variations.

Figure 3:
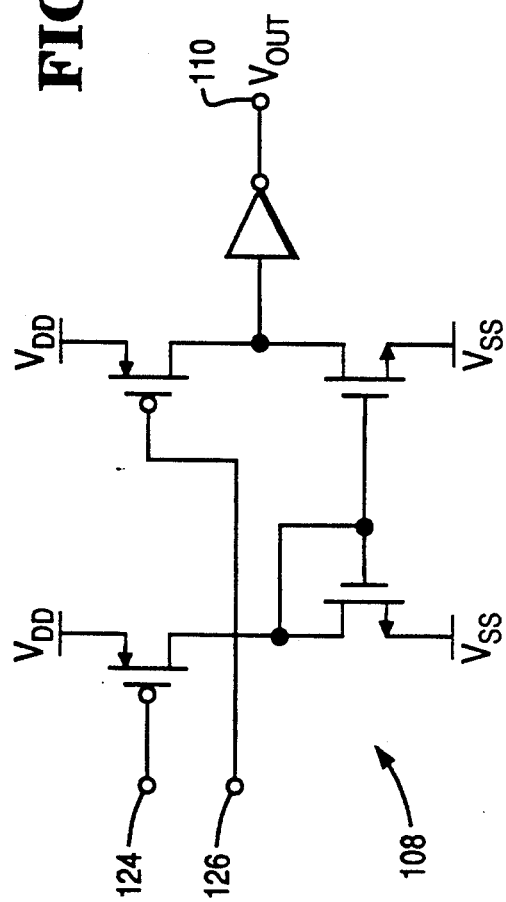
FIG. 3 is a schematic diagram of a differential to single ended converter circuit of the CMOS oscillator circuit of FIG. 1.

To improve the duty cycle of the output waveform generated by the CMOS oscillator circuit 100, the differential to single ended converter means 108 is used for the illustrated embodiment of the oscillator circuit 100. A schematic diagram of the differential to single ended converter means 108 is shown in FIG. 3 and includes differential inputs 124, 126 and the output 110 of the oscillator circuit 100. By converting the differential output signals from the differential ring oscillator 104 into a single-ended output signal at the oscillator output 110, the duty cycle of the output waveform can be significantly improved since the duty cycle is then determined by the crossover point of the differential output signals. Because the oscillator cells are symmetrical, the time interval between each crossover point is a constant.

Figure 5:
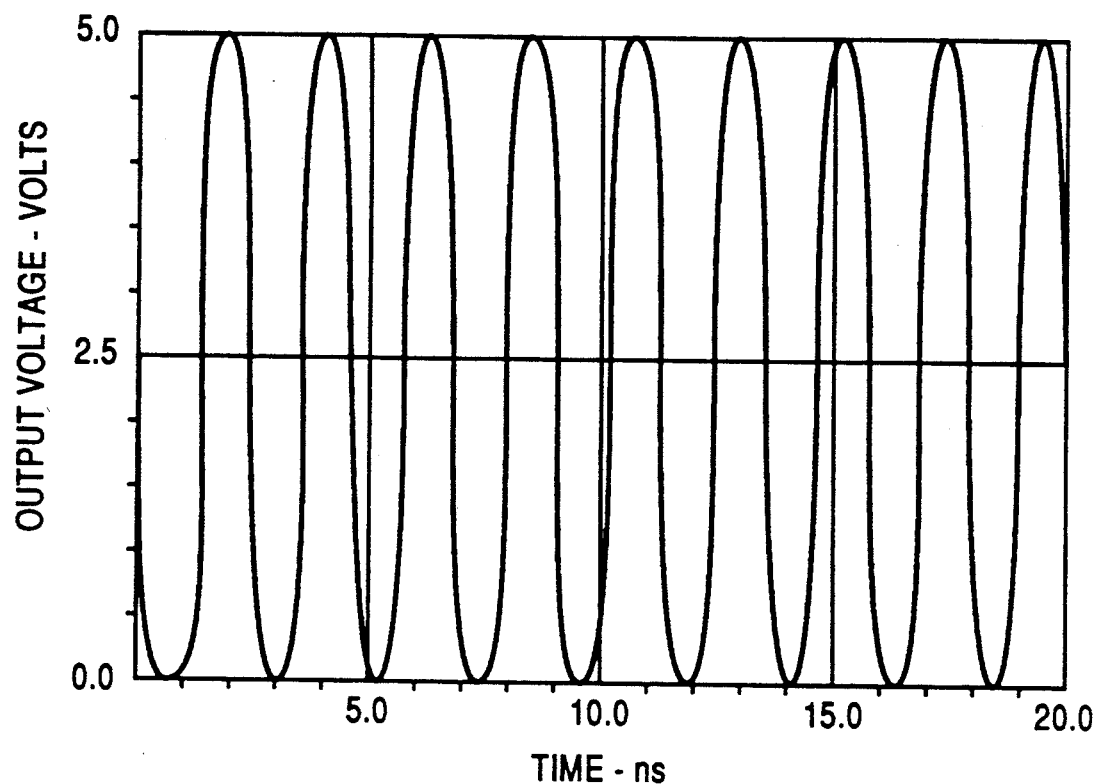
FIG. 5 is a graph of a simulated output signal for the CMOS oscillator circuit of FIG. 1.
Figure 6:
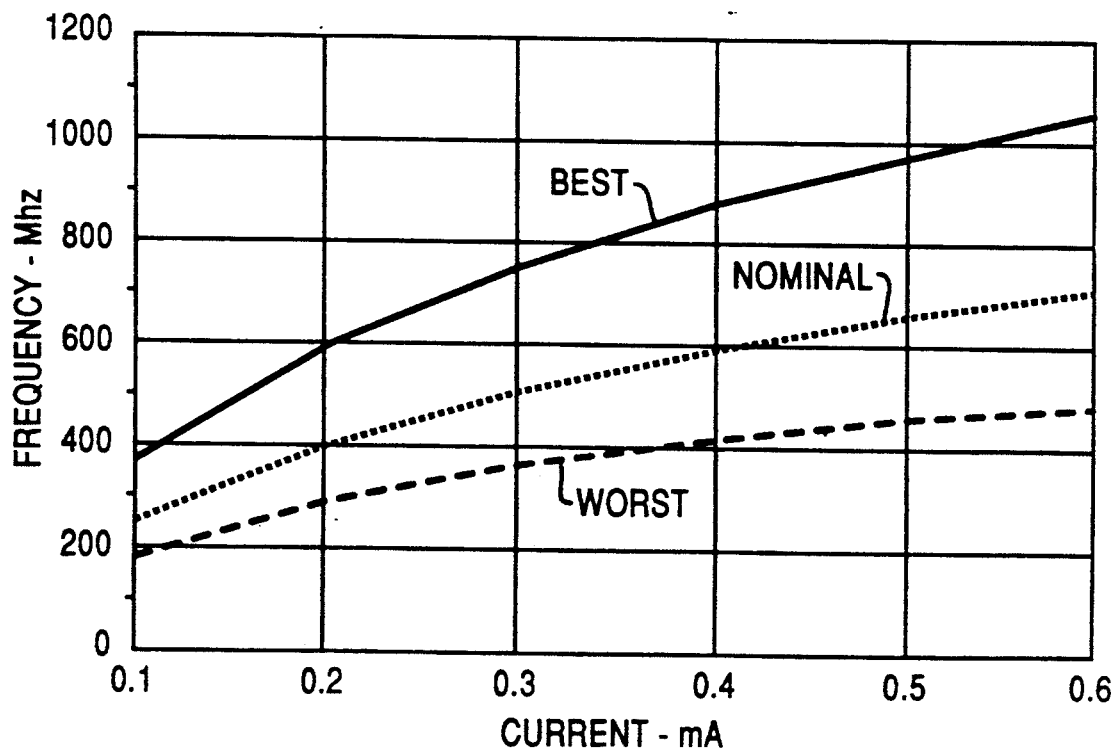
FIG. 6 is a graph of oscillation frequency versus control current for the simulation of FIG. 5.

Simulation results are shown in FIGS. 5 and 6 which illustrate graphs of the output signal from the CMOS oscillator circuit 100 and the effective frequency versus current characteristics for the circuit of FIG. respectively. The output signal shown in FIG. 5 illustrates the excellent duty cycle obtained from the oscillator circuit of FIG. 1 which eliminates the need for a divide by two circuit to improve the duty cycle. In addition, a full rail-to-rail swing is achieved even at the highest frequencies of oscillation of the circuit. Under nominal operating conditions, the duty cycle is 50/50. Under the worst case conditions, where fast NMOS and slow PMOS transistors are present, the duty cycle is still 47/53. This worst case condition represents less than 0.12 ns deviation from the bit center at an oscillation frequency of 266 Mhz.

In FIG. 6, simulated frequency versus control current I1 are graphed for best, nominal, and worst case conditions while varying the control current I1 over a current range from 0.1 mA to 0.6 mA. For the nominal case, the CMOS oscillator circuit 100 covers a frequency range from 260 Mhz to 700 Mhz. For applications which require a lower frequency range, either the number of oscillator cells 106 can be increased or a divider circuit can be used to reduce the output frequency.

Having thus described the invention of the present application in detail and by reference to preferred embodiments thereof, it will be apparent that modifications and variations are possible without departing from the scope of the invention defined in the appended claims.

What is claimed is:

1. An integrated circuit device comprising:
    a differential inverter connected between first and second controlled current sources, wherein said differential inverter receives differential input signals and provides differential inverted output signals in response thereto; and
    a booster circuit connected to said differential inverter to increase the switching speed of said differential inverter.

2. The device of claim 1 wherein said differential inverter includes first and second single signal inverters connected in parallel between said first and second controlled current sources.

3. The device of claim 2 wherein said single signal inverters are CMOS inverters.

4. The device of claim 3 wherein each of said single signal inverters receives a respective one of said differential input signals.

5. The device of claim 4 wherein each of said controlled current sources is a MOS transistor with a control gate.

6. The device of claim 5, further comprising:
    a bias circuit having output lines connected to said gates and providing bias signals thereto, said bias circuit including a variable current source with said bias signals being generated in response to the current flow in said variable current source.

7. The device of claim 4:
    wherein said booster circuit is connected to said single signal inverters.

8. The device of claim 7 wherein:
    each of said single signal inverters has an input and an output line, said input lines receiving said differential input signals, respectively, and said output lines providing an inverted form of said signals; and
    said booster circuit includes a third inverter sharing the input and output lines with said first single signal inverter and a fourth inverter sharing the input and output lines with said second single signal inverter.

9. The device of claim 8, further comprising:
    third, fourth, fifth and sixth controlled current sources;
    wherein said third inverter is connected between said third and fourth controlled current sources; and
    wherein said fourth inverter is connected between said fifth and sixth controlled current sources.

10. An integrated circuit device comprising: r first and second controlled current sources; wherein each of said current sources is a MOS transistor with a control gate;
    a differential inverter having first and second single signal CMOS inverters connected in parallel between said first and second controlled current sources; wherein said differential inverter receives differential input signals and each of said single signal inverters receives a respective one of said signals;
    a bias circuit having output lines connected to said control gates and providing bias signals thereto, said bias circuit including a variable current source with said bias signals being generated in response to the current flow in said variable current source;

a booster circuit connected to said single signal inverters to increase the switching speed of said differential inverter; wherein each of said single signal inverters has an input line and an output line, said input lines receiving said differential input signals, respectively, and said output lines providing an inverted form of said signals; and wherein said booster circuit includes a third inverter sharing the input and output lines with said first single signal inverter and a fourth inverter sharing the input and output lines with said second single signal inverter; and third, fourth, fifth and sixth controlled current sources; wherein said third inverter is connected between said third and fourth controlled current sources; and wherein said fourth inverter is connected between said fifth and sixth controlled current sources.

11. A current-controlled oscillator circuit comprising:
an odd plurality of oscillator cells interconnected in a ring configuration of each comprising;
  a first current source transistor for charging said oscillator cell and a second current source transistor for discharging said oscillator cell; and
  booster circuit means for assisting the operation of said first and second current source transistors and wherein said oscillator cell controller means further comprises booster controller means for controlling said booster circuit means; and
oscillator cell controller means for generating control signals to drive said first and second current source transistors of said oscillator cells, said oscillator cell controller means comprising a controlled current source with said control signals being generated in response to current flow in said controlled current source.

12. A current-controlled oscillator circuit as claimed in claim 11 wherein said first current source transistor and said second current source transistor of each of said oscillator cells are current-mirrored from current flowing in said controlled current source.

13. A current-controlled oscillator circuit as claimed in claim 12 wherein said oscillator cells comprise differential oscillator cells and said current-controlled oscillator circuit further comprises differential to single ended converter means connected to said odd plurality of differential oscillator cells for generating a single ended output signal for said current-controlled oscillator circuit.

14. A current-controlled oscillator circuit as claimed in claim 13 wherein said differential oscillator cells each comprise:
  first and second CMOS transistors each having gate, drain and source, and being connected in series between said first current source transistor and said second current source transistor, said first and second CMOS transistors having their gates connected to one another to define a first input for the cell and the interconnection between said first and second CMOS transistors defining a first output for the cell; and
  third and fourth CMOS transistors each having gate, drain and source, and being connected in series between said first current source transistor and said second current source transistor, said third and fourth CMOS transistors having their gates connected to one another to define a second input for the cell and the interconnection between said third and fourth CMOS transistors defining a second output for the cell;
  said first input of each cell being connected to the first output of a cell preceding it in the ring configuration, said second input of each cell being connected to the second output of the cell preceding it in the ring configuration, said first output being connected to the first input of a cell succeeding it in the ring configuration, and said second output being connected to the second input of the cell succeeding it in the ring configuration.

15. A current-controlled oscillator circuit as claimed in claim 14 wherein said booster circuit means comprises:
  first current source booster transistor means for charging said oscillator cell and second current source booster transistor means for discharging said oscillator cell;
  first and second CMOS booster transistors each having gate, drain and source, and being connected in series between said first current source booster transistor means and said second current source booster transistor means, said first and second CMOS booster transistors having their gates connected to one another and to said first input for the cell and the interconnection between said first and second CMOS booster transistors being connected to said first output for the cell; and
  third and fourth CMOS booster transistors each having gate, drain and source, and being connected in series between said first current source booster transistor means and said second current source booster transistor means, said third and fourth CMOS booster transistors having their gates connected to one another and to said second input for the cell and the interconnection between said third and fourth CMOS booster transistors being connected to said second output for the cell;
  said first and second current source booster transistor means being driven by said booster control signals.

16. A current-controlled oscillator circuit as claimed in claim 15 wherein said booster controller means of said oscillator cell controller means comprises a current source for generating a booster control current, and said first and second current source booster transistor means of each of said oscillator cells are current-mirrored from said booster control current.

17. An oscillator circuit having its frequency of oscillation controlled by a frequency control signal, said oscillator circuit comprising:
an odd plurality of oscillator cells interconnected in a ring configuration wherein each of said oscillator cells comprises:
  a first current source transistor for charging said oscillator cell and a second current source transistor for discharging said oscillator cell; and
  booster circuit means for assisting the operation of said first and second current source transistors and wherein said oscillator cell controller means further comprises booster controller means for controlling said booster circuit means; and
oscillator cell controller means for generating control signals to drive said first and second current source transistors of said oscillator cells, said oscillator cell controller means being responsive to said frequency control signal for generating said control signals.

18. An oscillator circuit as claimed in claim 17 wherein said frequency control signal comprises a current signal and said oscillator cell controller means comprises a controlled current source with the current flow through said controlled current source determining the frequency of oscillation of said oscillator circuit.

19. An oscillator circuit as claimed in claim 18 wherein in said first current source transistor and said second current source transistor of each of said cells are current-mirrored from current flow through said controlled current source.

20. An oscillator circuit as claimed in claim 17 wherein said frequency control signal comprises a voltage signal and said oscillator cell controller means comprises a controlled current source with the current flow through said controlled current source determining the frequency of oscillation of said oscillator circuit, said oscillator circuit further comprising voltage to current converter means for converting said voltage signal to a current which defines the current flow through said controlled current source.

21. An oscillator circuit as claimed in claim 20 wherein said first current source transistor and said second current source transistor of each of said oscillator cells are current-mirrored from current flow through said controlled current source.

22. An oscillator circuit as claimed in claim 17 wherein said oscillator cells comprise differential oscillator cells and said oscillator circuit further comprises differential to single ended converter means connected to said odd plurality of differential oscillator cells for generating a single ended output signal for said oscillator circuit.

23. An oscillator circuit as claimed in claim 22 wherein said differential oscillator cells each comprise:
first and second CMOS transistors each having gate, drain and source, and being connected in series between said first current source transistor and said second current source transistor, said first and second CMOS transistors having their gates connected to one another to define a first input for the cell and the interconnection between said first and second CMOS transistors defining a first output for the cell; and
third and fourth CMOS transistors each having gate, drain and source, and being connected in series between said first current source transistor and said second current source transistor, said third and fourth CMOS transistors having their gates connected to one another to define a second input for the cell and the interconnection between said third and fourth CMOS transistors defining a second output for the cell;
said first input of each cell being connected to the first output of a cell preceding it in the ring configuration, said second input of each cell being connected to the second output of the cell preceding it in the ring configuration, said first output being connected to the first input of a cell succeeding it in the ring configuration, and said second output being connected to the second input of the cell succeeding it in the ring configuration.

24. An oscillator circuit as claimed in claim 29 wherein said booster circuit means comprises:
first current source booster transistor means for charging said oscillator cell and second current source booster transistor means for discharging said oscillator cell;
first and second CMOS booster transistors each having gate, drain and source, and being connected in series between said first current source booster transistor means and said second current source booster transistor means, said first and second CMOS booster transistors having their gates connected to one another and to said first input for the cell and the interconnection between said first and second CMOS booster transistors being connected to said first output for the cell; and
third and fourth CMOS booster transistors each having gate drain and source, and being connected in series between said first current source booster transistor means and said second current source booster transistor means, said third and fourth CMOS booster transistors having their gates connected to one another and to said second input for the cell and the interconnection between said third and fourth CMOS booster transistors being connected to said second output for the cell;
said first and second current source booster transistor means being driven by said booster control signals.

25. A current-controlled oscillator circuit as claimed in claim 24 wherein said booster controller means of said oscillator cell controller means comprises a current source for generating a booster control current, and said first and second current source booster transistor means of each of said oscillator cells are current-mirrored from said booster control current.

* * * * *

UNITED STATES PATENT AND TRADEMARK OFFICE
CERTIFICATE OF CORRECTION

PATENT NO. : 5,300,898
DATED : April 5, 1994
INVENTOR(S) : Bao-Long Chen et al.

It is certified that error appears in the above-indentified patent and that said Letters Patent is hereby corrected as shown below:

Column 8, Line 52, delete "r" before "first".

Column 12, Line 14, "claim 29" should be --claim 23--.

Signed and Sealed this

Thirtieth Day of May, 1995

Attest:

BRUCE LEHMAN

Attesting Officer

Commissioner of Patents and Trademarks